United States Patent [19]

Keller

[11] 4,006,949
[45] Feb. 8, 1977

[54] CABINET FOR MOUNTING ELECTRONIC EQUIPMENT

[75] Inventor: Roman Keller, Erlangen, Germany

[73] Assignee: Siemens Aktiengesellschaft, Munich, Germany

[22] Filed: Mar. 22, 1973

[21] Appl. No.: 343,955

[30] Foreign Application Priority Data

Mar. 24, 1972 Germany .......................... 2214538

[52] U.S. Cl. .............................................. 312/263
[51] Int. Cl.² ....................................... A47B 48/00
[58] Field of Search .................. 312/263, 111, 140;
52/758 F, 753 F

[56] References Cited

UNITED STATES PATENTS

| | | | |
|---|---|---|---|
| 1,213,599 | 1/1917 | Dow | 52/758 F |
| 2,240,268 | 4/1941 | Ruddy | 52/758 F |
| 2,571,622 | 10/1951 | Schmidt | 312/263 |
| 2,742,770 | 4/1956 | Graham | 52/758 F |
| 3,590,542 | 7/1971 | Gallay | 52/758 F |

Primary Examiner—Peter M. Caun
Attorney, Agent, or Firm—Kenyon & Kenyon Reilly Carr & Chapin

[57] ABSTRACT

A cabinet for mounting electronic equipment is disclosed. At least two joints corresponding to each one of the side walls of the cabinet are provided for respectively connecting the bottom end part and the top end part of the cabinet to the same. Each of the joints includes three threaded bores arranged to define the respective corners of a triangle. Three threaded members threadably engage corresponding ones of the bores to join the side wall and the corresponding one of the end parts together. The joint configured in this manner ensures that the cabinet can always be screwed together square and true to size with a minimum of effort.

1 Claim, 3 Drawing Figures

CABINET FOR MOUNTING ELECTRONIC EQUIPMENT

BACKGROUND OF THE INVENTION

The invention relates to a cabinet for mounting electronic equipment with screw connections between the side walls and the base and cover.

Cabinets for mounting electronic equipment are known as electronic cabinets and are commercially available. These cabinets are in general constructed of frames which are enclosed with flat cover sheets. The parts of the cabinet frame are connected at the cabinet corners by welded joints and so assure sufficient mechanical strength. It is a disadvantage of these cabinets that they cannot be disassembled into parts, shipped and stored in that condition, or that they must be welded together at the installation site if, for instance, shipment in parts is necessary for space considerations.

Deutsche Offenlegungsschrift 1,561,623, for instance, discloses an electronic cabinet of the kind mentioned above. Because of the screw connections between the side walls, the base and the top, the above-mentioned shortcomings are absent in this electronic cabinet. However, sufficient mechanical strength is not assured with the screw connections. Shear and similar deformations of the cabinet can occur and the cabinet cannot be loaded to any great extent.

SUMMARY OF THE INVENTION

It is an object of the invention to provide a cabinet for mounting electronic equipment wherein screw connections between individual parts of the cabinets are provided in such a manner that to the greatest possible extent it has the same mechanical strength as a welded cabinet.

According to the invention, between each side wall and the base and the top, respectively, at least one joining area is provided in which the side wall and the base or the top, respectively, are screwed together with three screws with corresponding tapped bores forming the corners of a triangle.

The cabinet for mounting electronic equipment of the invention includes side walls, a bottom end part and a top end part. According to a feature of the invention, at least two joints corresponding to each one of the side walls for respectively connecting the bottom end part and the top end part to the one side wall are provided. Each of the joints includes three threaded bore means arranged to define the respective corners of a triangle, and three threaded members threadably engage corresponding ones of the bore means to join the side wall and the corresponding one of the end parts together. With this three-point connection, shear and torsion between the base or the top, respectively, and the side wall are precluded. The strength of the cabinet is therefore considerably greater than with the customary screw connections and is as great as in cabinets of welded construction.

In each joining area at least one screw is preferably guided in a centering bushing. The bushing engages with a bore of the side wall and/or the base or the top. A pair of centering bushings may be provided for each screw, where one half of the pair of centering bushings can be fastened in the side wall and the second half of the pair in the base or the top plate. At least one half of each pair of centering bushings can be configured as a tapped thread. The centering bushings keep shear forces away from the screws whereby the mechanical strength of the joints is further increased. The centering bushings ensure furthermore that the parts of the cabinet can always be fastened together by screws so as to be square and true to size with minimum effort and without the use of fixtures and gages.

The threaded members then can be respective screws and each joint can include centering bushings for respective ones of the screws, each of the centering bushings being a bushing pair consisting of a first pair body and a second pair body. The first pair body is fixedly mounted in the side wall corresponding to the joint and the second pair body is fixedly mounted in the end part of the cabinet likewise corresponding to the joint. One of the pair bodies of each of the bushing pairs has a bushing bore formed therein. The other one of the pair bodies of each one of the bushing pairs has a projection for engaging the bushing bore of the corresponding pair body. The three threaded bore means can be three bores respectively. At least one pair body of each of the bushing pairs has a corresponding one of the last-mentioned bores formed therein for receiving the screw corresponding to the bushing pair.

Because of its special connection between the sides and the base and the top, the cabinet according to the invention affords the advantage of being extremely stable mechanically and has a strength which is equivalent to the strength of a welded cabinet. Furthermore the cabinet of the invention can be disassembled at any time or can be assembled anywhere. The shipping and storing of the parts of the disassembled cabinet is therefore possible. In assembling the cabinet, trueness to size and squareness is always ensured by simple means and without the need to use special means for this purpose. Placing electronic cabinets side by side in a manner secure against displacement is facilitated by connecting adjoining electronic cabinets with each other by means of intermediate members.

Although the invention is illustrated and described herein as a cabinet for mounting electronic equipment, it is nevertheless not intended to be limited to the details shown, since various modifications may be made therein within the scope and the range of the claims. The invention, however, together with additional objects and advantages will be best understood from the following description and in connection with the accompanying drawings.

BRIEF DESCRIPTION OF THE DRAWINGS

Embodiments of the cabinet for mounting electronic equipment according to the invention are illustrated in the following three FIGS. described below. Similar or like parts are designated by the same reference numeral in each FIG. in which they appear.

DESCRIPTION OF THE PREFERRED EMBODIMENTS OF THE INVENTION

Figure 1:
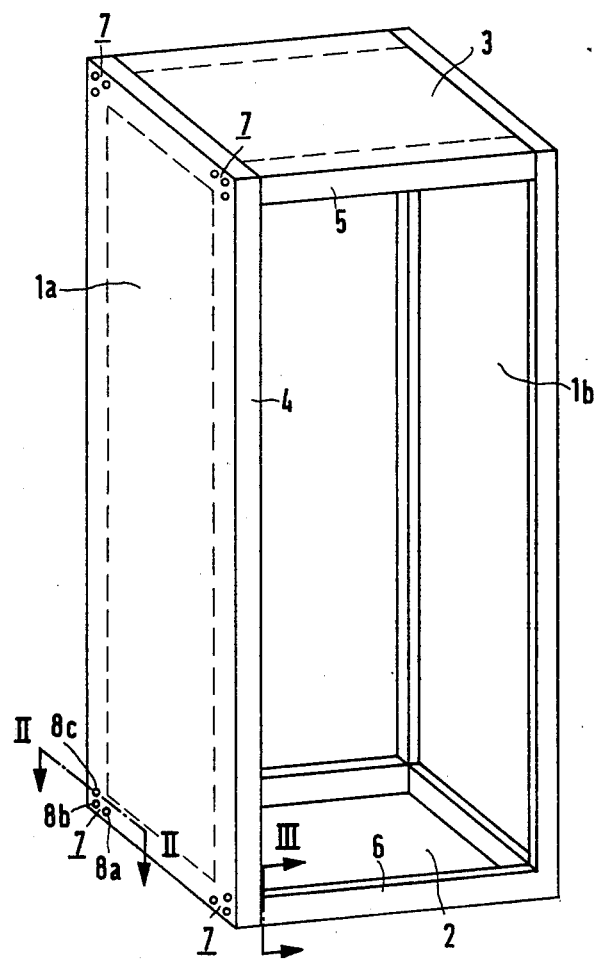
FIG. 1 is a perspective view of the electronic cabinet according to the invention. In order to afford an unobstructed view, the front cover of the cabinet has been omitted; this cover can be, for example, a door.

Referring to FIG. 1, the cabinet is assembled from two side walls 1a and 1b, a base 2 and a top 3. The sides 1a and 1b of the cabinet frame structure are formed by respective continuous welded and perforated frames 4. The frames 4 are covered by respective flat cover sheets. Two such frames 4 are joined by four equal, angle head and base sections 5 and 6 to form a frame structure. Together with additional flat cover sheets, the base 2 and the top 3 are constructed from the base and head sections 6 and 5.

The sides 1a and 1b are screwed to the base 2 and the top 3 at each cabinet corner. For making the screw connection, a joining area 7 is provided at each cabinet corner wherein three screw connections 8a to 8c are arranged. The screws 8 of each joining area form the corners of a triangle. In the illustrated embodiment, the joining area is arranged so that the frame of each side part 1a is screwed to a head and base section 5 and 6. By arranging the screws 8 to form a three-point connection, rotation of the side parts 1 with respect to the base 2 or the top 3 and lateral displacement are prevented.

Figure 2:
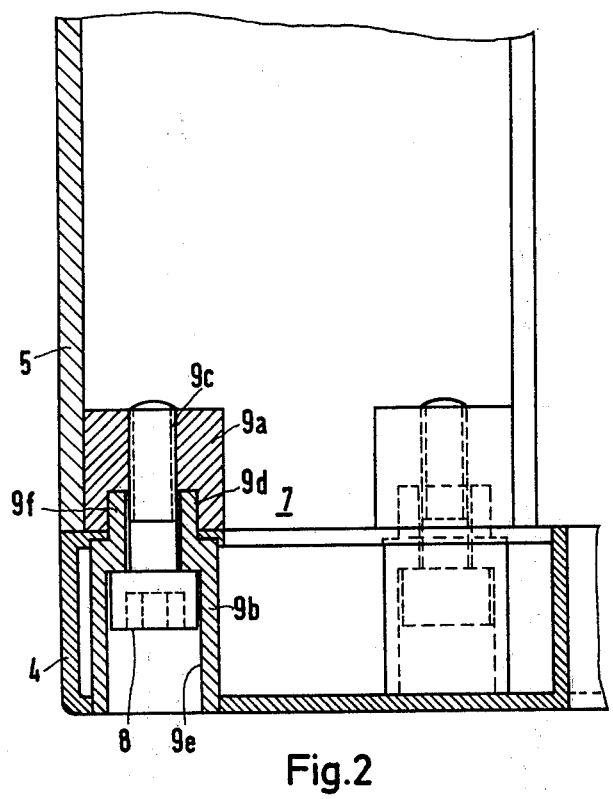
FIG. 2 is a section view taken along lines II—II in FIG. 1 and shows the screw connections at the connecting area in the cabinet corner whereat the side walls are secured to the base of the cabinet.

In FIG. 2 is illustrated a center bushing 9 comprising bushing halves 9a and 9b. The halves of the bushing 9 are respectively welded at each screw location into the structural section material of the frame 4 and into the angle shape of the base 5. The half 9b of a centering bushing pair engages a bore 9d of the half 9a of the same pair. The inner bore 9c of the halves 9a and 9b of the centering bushing pair are made as tapped threads for the screw 8, which may be a socket-head screw. By means of the engagement of projections 9f of the halves 9b with bores 9d of corresponding halves 9a, the result is achieved that in assembling the cabinet frame structure, no gages or similar devices are needed and that the cabinet can be bolted together true to size with very little effort. The screws 8 are furthermore protected against shear stresses by the halves 9b. The assembled electronic cabinet can therefore also be subjected to heavier loads and its mechanical strength is practically identical with the strength of a welded electronic cabinet. It should be added that as centering bushings, sleeves can also be used which engage in a bore of the side part and a bore of the base or the top. This measure can be taken particularly if the side part or the base is constructed not with a frame or members made of structural sections or, if for other reasons, no centering bushings 9, as they are shown in the illustrated embodiment, can be fastened at the joining area. The described advantages of the centering bushings are not lost in this type of construction either. In addition, the screws can also be screwed into the centering bushings from the inside of the cabinet.

Figure 3:
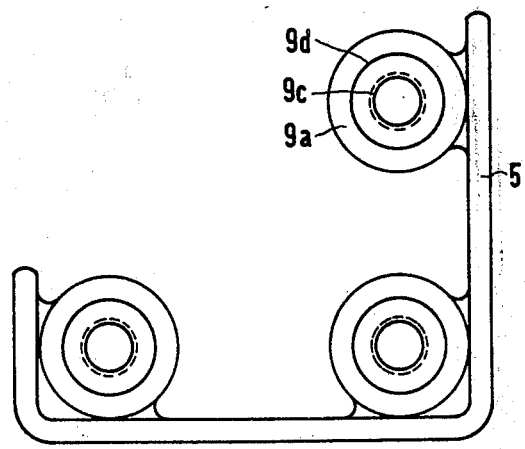
FIG. 3 is taken along lines III—III of FIG. 1 and is a view of the connection at the base section.

FIG. 3 is taken at a base section 6. The arrangement of the halves 9a of the pairs of centering bushings in a triangle is shown. In the illustrated embodiment, the tapped bores 9c of the centering bushings define the corners of a right triangle. This triangle can, of course, also be a triangle with other than a right angle; the advantages obtained by the joining areas 7 are not affected thereby.

FIG. 2 shows that a bore 9e of the half 9b of the pair of centering bushings is brought to the outside through the wall of the cabinet. In the illustrated embodiment this hole 9e receives at the same time the head of the socket-head screw 8. It is, however, particularly advantageous, that intermediate members can be inserted into these holes 9e, by means of which adjoining electronic cabinets can be installed side by side true to size and can be secured against displacement.

What is claimed is:

1. A cabinet for mounting electronic equipment comprising:
   a. side walls;
   b. a bottom end part;
   c. a top end part, the side walls and the end parts of an assembled cabinet cojointly defining respective cabinet corners;
   d. a plurality of joints located at said corners each of said joints comprising three bushing pairs arranged to define the respective corners of a triangle, each bushing pair consisting of a first pair body and a second pair body, the first pair body fixedly mounted in the side wall corresponding to the joint and the second pair body fixedly mounted in the end part of the cabinet corresponding to the same joint, one of the pair bodies of each of said bushing pairs having a bushing bore formed therein, the other one of said paired bodies of each of said bushing pairs having a projection for engaging the bushing bore of the corresponding pair body, a threaded bore formed in at least one pair body of each of said bushing pairs and three screws threadably engaging corresponding ones of said threaded bores to join the side wall and the corresponding one of said end parts together.

* * * * *